United States Patent
Dening et al.

(10) Patent No.: US 7,132,891 B1
(45) Date of Patent: Nov. 7, 2006

(54) POWER AMPLIFIER CONTROL USING A SWITCHING POWER SUPPLY

(75) Inventors: David Dening, Stokesdale, NC (US);
Ulrik R. Madsen, Herning (DK);
Victor E. Steel, Oak Ridge, NC (US);
Jon D. Jorgenson, Greensboro, NC (US); Michael R. Kay, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 163 days.

(21) Appl. No.: 10/920,073

(22) Filed: Aug. 17, 2004

(51) Int. Cl.
*H03F 3/04* (2006.01)

(52) U.S. Cl. .................. 330/297; 330/133

(58) Field of Classification Search ............. 330/297, 330/133, 285, 296
See application file for complete search history.

(56) References Cited

U.S. PATENT DOCUMENTS

| | | | | |
|---|---|---|---|---|
| 5,126,688 A | 6/1992 | Nakanishi et al. | .......... | 330/285 |
| 5,182,527 A | 1/1993 | Nakanishi et al. | .......... | 330/285 |
| 5,608,353 A | 3/1997 | Pratt | .......... | 330/295 |
| 5,629,648 A | 5/1997 | Pratt | .......... | 330/289 |
| 5,757,231 A * | 5/1998 | Tozawa | .......... | 330/151 |
| 5,808,453 A | 9/1998 | Lee et al. | .......... | 323/224 |
| 5,826,170 A * | 10/1998 | Hirschfield et al. | .......... | 455/13.4 |
| 5,870,296 A | 2/1999 | Schaffer | .......... | 363/65 |
| 5,903,854 A * | 5/1999 | Abe et al. | .......... | 455/575.1 |
| 6,137,274 A | 10/2000 | Rajagopalan | .......... | 323/272 |
| 6,198,347 B1 | 3/2001 | Sander et al. | .......... | 330/251 |
| 6,313,705 B1 | 11/2001 | Dening et al. | .......... | 330/276 |
| 6,414,469 B1 | 7/2002 | Zhou et al. | .......... | 323/272 |
| 6,459,602 B1 | 10/2002 | Lipcsei | .......... | 363/132 |
| RE38,140 E | 6/2003 | Schaffer | .......... | 363/65 |
| 6,624,702 B1 | 9/2003 | Dening | .......... | 330/297 |
| 6,701,134 B1 | 3/2004 | Epperson | .......... | 455/102 |
| 6,701,138 B1 | 3/2004 | Epperson et al. | .......... | 455/127 |
| 6,724,252 B1 | 4/2004 | Ngo et al. | .......... | 330/133 |
| 6,734,724 B1 | 5/2004 | Schell et al. | .......... | 330/10 |
| 6,844,776 B1 | 1/2005 | Schell et al. | .......... | 330/10 |
| 2003/0054778 A1 | 3/2003 | Hecht | .......... | 455/115 |
| 2004/0183511 A1 | 9/2004 | Dening | .......... | 323/282 |

OTHER PUBLICATIONS

P. Asbeck, G. Hanington, P.F. Chen, and L. Larson, "Efficiency and Linearity Improvement in Power Amplifiers for Wireless Communications," University of California, San Diego, La Jolla, CA, IEEE 1998, pp. 15-18.

* cited by examiner

*Primary Examiner*—Henry Choe
(74) *Attorney, Agent, or Firm*—Withrow & Terranova, PLLC

(57) ABSTRACT

A system is provided for adjusting an output power of a multi-stage power amplifier by controlling a supply voltage provided to one or more output amplifier stages of the power amplifier using a switching DC—DC converter. In general, the system includes a power amplifier including an input amplifier stage and one or more output amplifier stages coupled in series with the input amplifier stage. The one or more output amplifier stages receive a variable supply voltage from switching DC—DC conversion circuitry. The switching DC—DC conversion circuitry provides the variable supply voltage based on an adjustable power control signal. By controlling the variable supply voltage provided to the one or more output stages, the switching DC—DC conversion circuitry controls an output power of the power amplifier based on the adjustable power control signal.

38 Claims, 9 Drawing Sheets

POWER AMPLIFIER CONTROL USING A SWITCHING POWER SUPPLY

FIELD OF THE INVENTION

The present invention relates to controlling the output power of a multistage radio frequency power amplifier by adjusting the power supply voltage level applied to the final stages of the power amplifier using a switching DC—DC converter.

BACKGROUND OF THE INVENTION

In recent years, worldwide demand for wireless cellular communications has increased dramatically. Mobile telephones manufactured to meet this burgeoning demand must adhere to standards such as the Global System for Mobile Communications (GSM) standard. Another standard, the Digital Cellular System (DCS) standard, is based on GSM, but is directed towards higher cell density and lower power. A third standard, Personal Communications Services (PCS), is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

One of the primary goals in designing mobile telephones is to reduce power consumption in order to increase battery-life. In large part, the power consumption of a mobile telephone is dependent upon the RF efficiency of a power amplifier in the transmit chain that operates to amplify a transmit signal prior sending the signal to the antenna for transmission. As described in U.S. Pat. No. 6,701,138, POWER AMPLIFIER CONTROL, issued Mar. 2, 2004, which is assigned to RF Micro Devices, Inc. of 7628 Thorndike Road, Greensboro, N.C. 27409 and is hereby incorporated by reference in its entirety, the efficiency of a multi-stage power amplifier may be increased by reducing a supply voltage provided to one or more output amplifier stages of the multi-stage power amplifier as the output power is reduced such that the output stages of the power amplifier continue to operate in saturation.

As described in U.S. Pat. No. 6,701,138, the supply voltage provided to the power amplifier may be controlled using a voltage regulator. The voltage regulator includes a series pass element, such as a field effect transistor (FET) coupled in series between a source voltage, such as a battery, and an input terminal of the power amplifier. The voltage regulator is controlled to control the supply voltage provided to the input terminal of the power amplifier. However, as output power is reduced, the supply voltage is also reduced. In doing so, the voltage drop across the series pass element is increased, and a larger portion of the power supplied from the battery is dissipated as heat.

Accordingly, there remains a need for a system that further improves the efficiency of a power amplifier.

SUMMARY OF THE INVENTION

The present invention provides a system for adjusting an output power of a multi-stage power amplifier by controlling a supply voltage provided to one or more output amplifier stages of the power amplifier using a switching DC—DC converter. In general, the system includes a power amplifier including an input amplifier stage and one or more output amplifier stages coupled in series with the input amplifier stage. The one or more output amplifier stages receive a variable supply voltage from switching DC—DC conversion circuitry. The switching DC—DC conversion circuitry provides the variable supply voltage based on an adjustable power control signal. By controlling the variable supply voltage provided to the one or more output stages, the switching DC—DC conversion circuitry controls an output power of the power amplifier based on the adjustable power control signal.

In one embodiment, the switching DC—DC conversion circuitry includes an oscillator, a converter control system, and a power train. The power train generates the variable supply voltage based on a control signal from the converter control system. The converter control system generates the control signal and controls a duty cycle of the control signal based on the adjustable power control signal and a clock signal. In order to reduce effects of the voltage ripple in the variable supply voltage caused by the clock signal, which defines the switching frequency of the switching DC—DC conversion circuitry, the oscillator may operate to periodically change the frequency of the clock signal, thereby periodically changing the frequency of the voltage ripple in the supply voltage. As a result, the spurious energy in the output of the power amplifier caused by mixing of a radio frequency (RF) input signal with the frequency of the voltage ripple is spread over multiple frequencies. In another embodiment, the oscillator may operate to change the frequency of the clock signal at a second frequency that is inversely related to the frequency of the clock signal, thereby further reducing the spurious energy in the output of the power amplifier.

The system also includes bias circuitry operating to bias the input amplifier stage and the one or more output amplifier stages. In one embodiment, the bias circuitry operates to provide an essentially constant bias to the input and output amplifier stages. In another embodiment, the bias circuitry provides an essentially constant bias to the input amplifier stage and a variable bias to the output amplifier stages that is reduced as the variable supply voltage is reduced.

In another embodiment, the switching DC—DC conversion circuitry is a multi-phase DC—DC converter. The multi-phase DC—DC converter includes a multi-phase converter control system, a multi-phase power train, and an oscillator. In general, the multi-phase DC—DC converter reduces a voltage ripple in the variable supply voltage as compared to a single-phase DC—DC converter, thereby reducing the magnitude of the resultant spurs in the output of the power amplifier.

In one embodiment, the power amplifier and the switching DC—DC conversion circuitry are incorporated into a single module. The switching DC—DC conversion circuitry includes one or more inductors. These inductors may be incorporated into the module or may be external components.

In another embodiment, the power amplifier and the switching DC—DC conversion circuitry are formed on a single semiconductor die. The switching DC—DC conversion circuitry includes one or more inductors. These inductors may be formed in the substrate of the semiconductor die or may be external components.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 5:
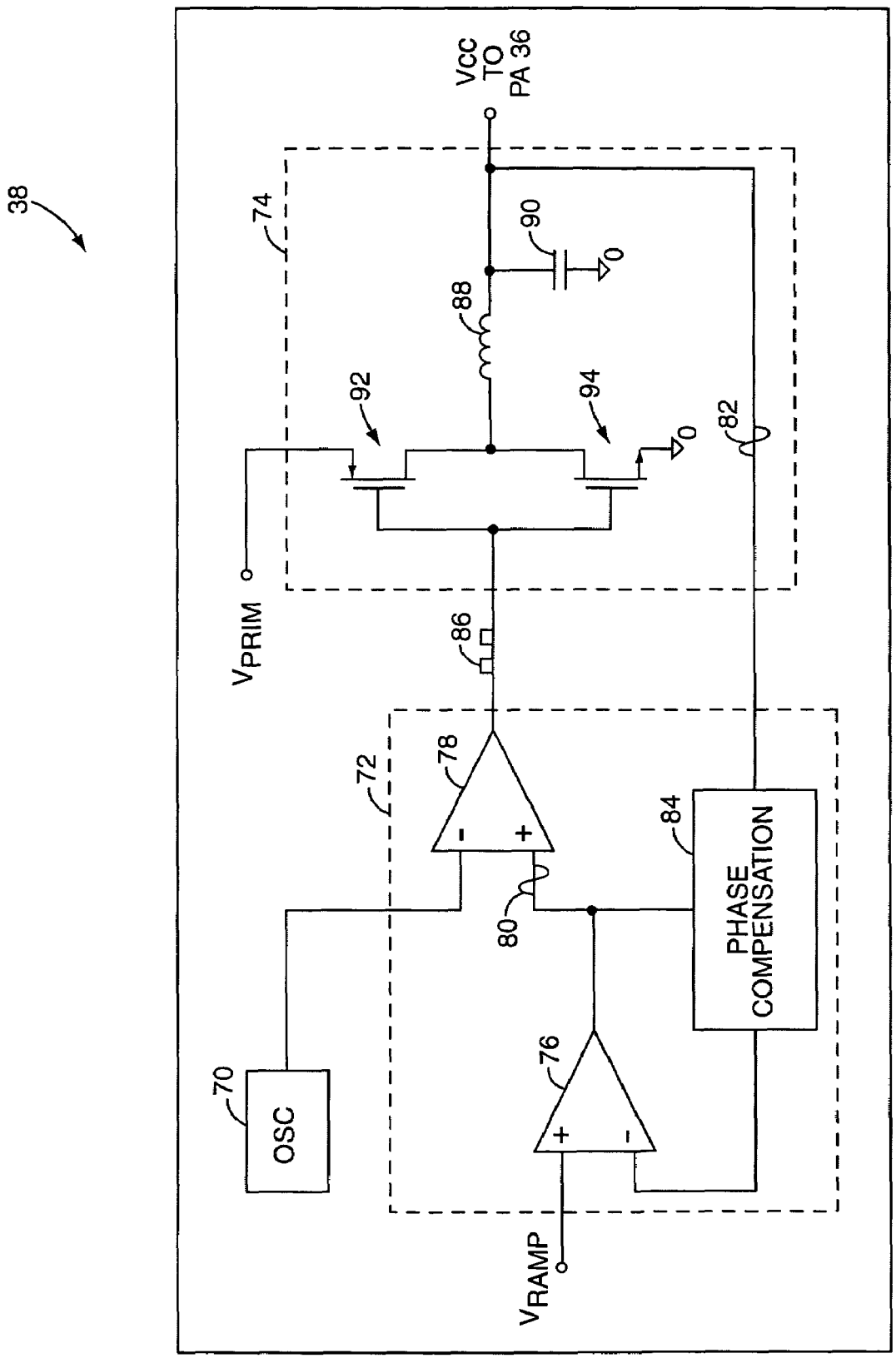
FIG. 5 is a more detailed illustration of the DC—DC conversion circuitry according to one embodiment of the present invention.
Figure 7:
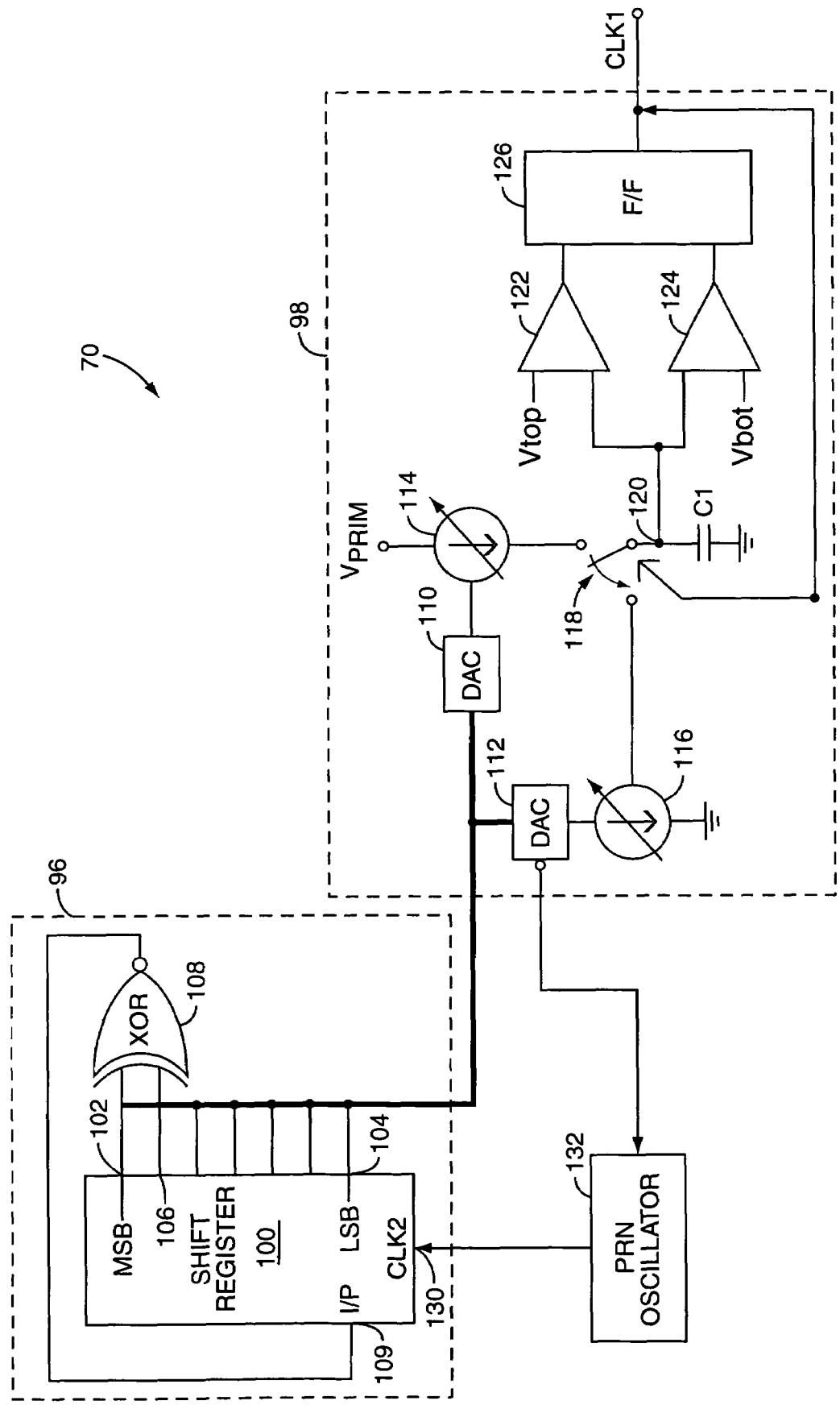
Figure 8:
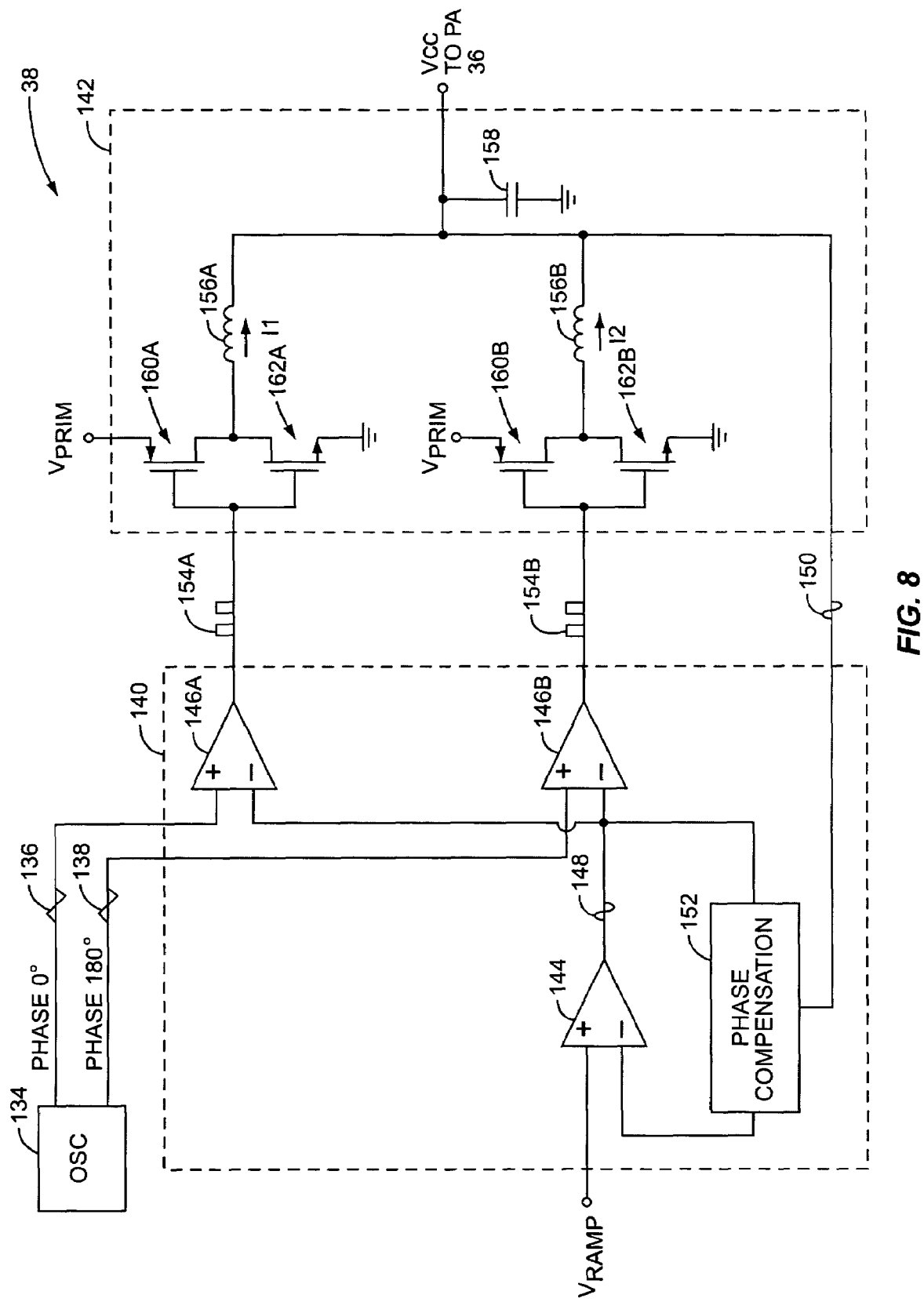
Figure 9:
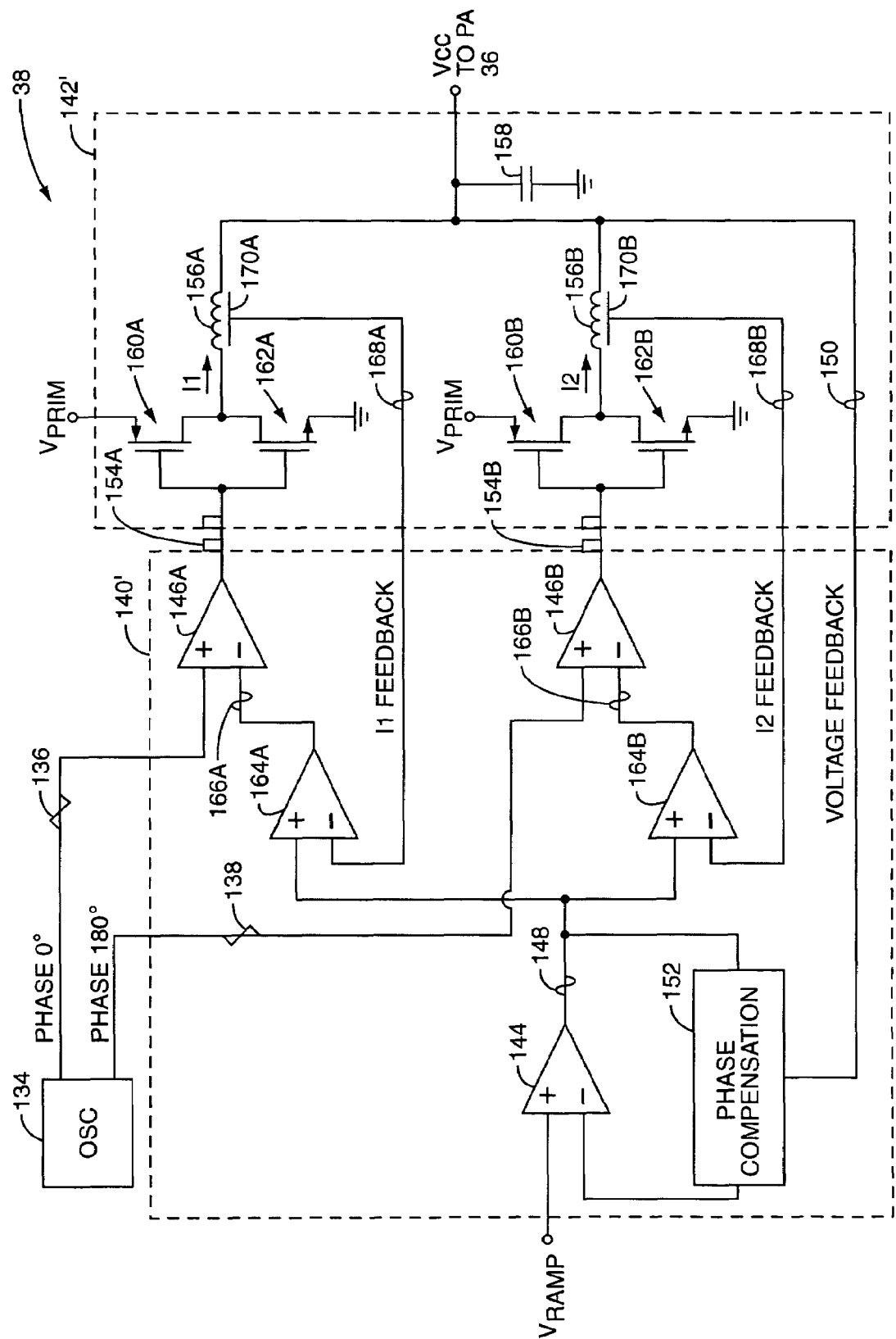

FIG. 7 a detailed illustration of an oscillator providing a clock signal to a control system of the DC—DC conversion circuitry of FIG. 5 according to another embodiment of the present invention;

FIG. 8 illustrates multi-phase DC—DC conversion circuitry according to one embodiment of the present invention; and FIG. 9 illustrates multi-phase DC—DC conversion circuitry having both voltage and current feedback loops according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Accurate and discrete power control can be achieved by varying the DC voltage supplied to the collectors or drains of the final amplifier stages of a power amplifier. As opposed to the prior art, radio frequency (RF) output power for the present invention has very little dependence on frequency, temperature, or input power when the supply voltage for the final amplifier stages is regulated to control output power. Adjusting the supply voltage rather than adjusting the bias of the amplifier stages results in smooth predictable control over the full range of power. The circuitry used to implement the invention may be incorporated into a single semiconductor or may comprise multiple discrete components.

Figure 1:
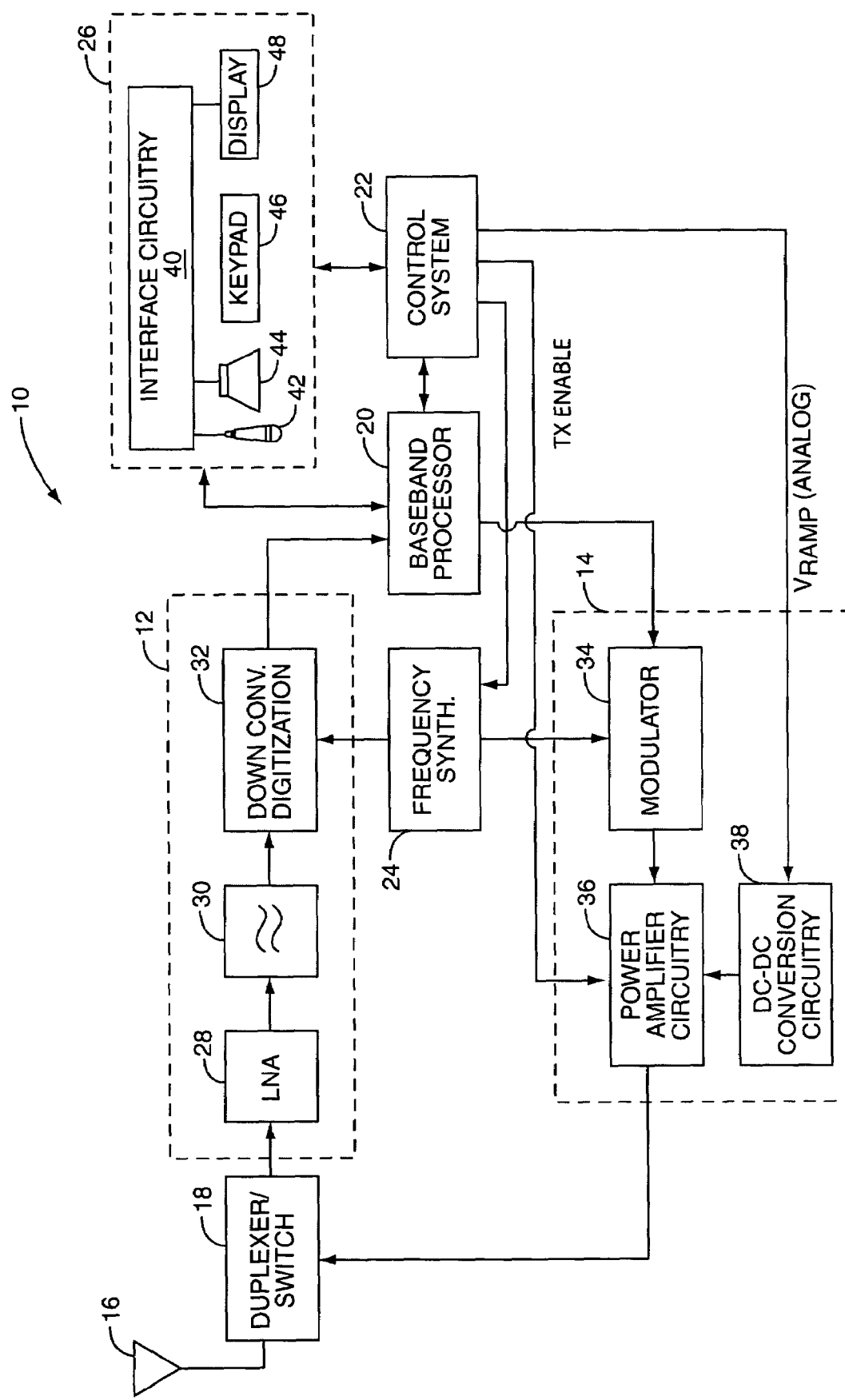
FIG. 1 is a basic block diagram of a mobile terminal including power amplifier circuitry and DC—DC conversion circuitry of the present invention.

The present invention is preferably incorporated in a mobile terminal 10, such a mobile telephone, personal digital assistant, or the like. The basic architecture of a mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the transmitter 14, where it is used by a modulator 34 to modulate a carrier signal that is at a desired transmit frequency. Power amplifier circuitry 36 amplifies the modulated carrier signal to a level appropriate for transmission from the antenna 16.

As described in further detail below, the power amplifier circuitry 36 provides gain for the signal to be transmitted under control of DC—DC conversion circuitry 38, which is preferably controlled by the control system 22 using an adjustable gain control signal ($V_{RAMP}$). In previously mentioned U.S. Pat. No. 6,701,138, the power amplifier circuitry 36 is controlled by power control circuitry including a voltage regulator rather than the DC—DC conversion circuitry 38. It should be noted that the efficiency of the mobile terminal 10 is further improved by using the DC—DC conversion circuitry 38 to control the power amplifier circuitry 36. This is due to the fact that voltage regulators require a series pass element, such as a field effect transistor (FET) between the source voltage and the output voltage. As the output voltage of the regulator is decreased, the amount of power dissipated as heat also increases, thereby decreasing efficiency. In contrast, the DC—DC conversion circuitry 38 requires no such pass element and therefore improves the efficiency of the mobile terminal 10.

In one embodiment, the bias for the amplifier circuitry 36 is relatively stable regardless of power, and varying the voltage supplied to the amplifier circuitry 36 controls actual power levels. The control system 22 may also provide a transmit enable signal (TX ENABLE) to effectively enable the power amplifier circuitry 36 during periods of transmission.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the I/O and interface circuitry 40. The keypad 46 and display 48 enable the user to interact with the mobile terminal 10, input numbers to be dialed, address book information, or the like, as well as monitor call progress information.

Figure 2:
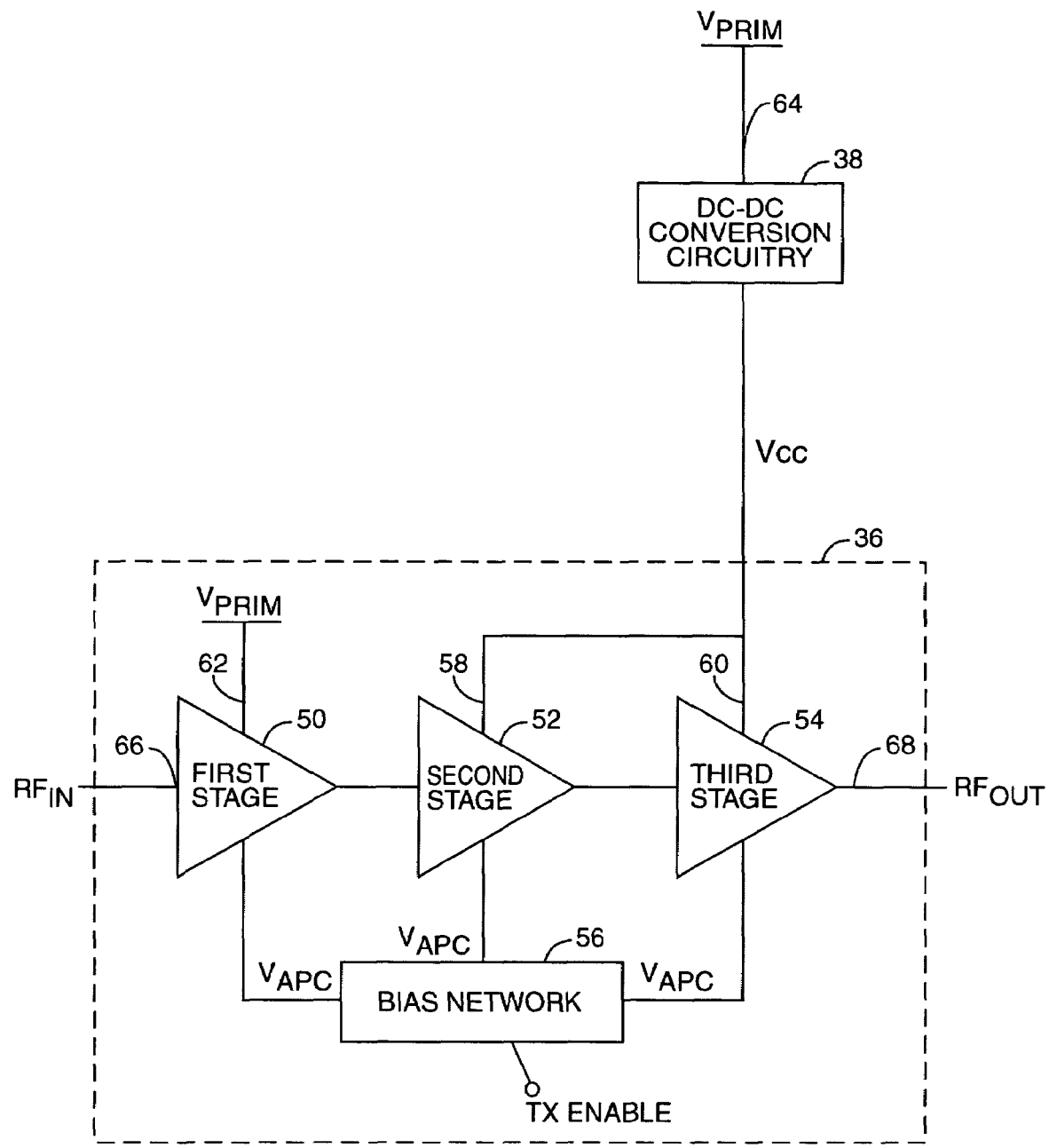
FIG. 2 is a more detailed block diagram of the power amplifier circuitry and the DC—DC conversion circuitry according to one embodiment of the present invention.

Turning now to FIG. 2, the power amplifier circuitry 36 is associated with the DC—DC conversion circuitry 38. In one embodiment, the power amplifier circuitry 36 and the DC—DC conversion circuitry 38 are incorporated into a single module. The power amplifier circuitry 36 primarily includes three amplifier stages, a first amplifier stage 50, a second amplifier stage 52, and a third amplifier stage 54, as well as a bias network 56 providing bias for each of the three amplifier stages 50, 52, and 54.

The adjustable power control signal ($V_{RAMP}$) is received by the DC—DC conversion circuitry 38 and used as a set-point voltage. Based on the adjustable power control signal ($V_{RAMP}$), the DC—DC conversion circuitry 38 controls a supply voltage ($V_{CC}$) provided to the rails 58 and 60 of the second and third amplifier stages 52 and 54, respectively. These rails 58 and 60 will typically be the collectors or drains of bipolar or field effect transistors forming the respective amplifier stages, as will be appreciated by those skilled in the art.

The rail 62 of the first amplifier stage 50 is connected directly to a fixed or primary voltage supply ($V_{PRIM}$), which will preferably also be connected to the terminal for the positive potential of a battery. The fixed or primary voltage ($V_{PRIM}$) is also preferably connected to an input terminal 64 of the DC—DC conversion circuitry 38. As noted, in one embodiment, the bias network 56 supplies a fixed bias to the three amplifier stages 50, 52, and 54, regardless of the collector/drain supply voltage ($V_{CC}$) provided to the second and third amplifier stages 52 and 54. The fixed bias incorporates traditional $V_{APC}$ signals, which are configured to maintain a constant bias. However, in another embodiment, the bias network 56 provides a constant bias to the first amplifier stage 50 and a variable bias that is reduced when the supply voltage ($V_{CC}$) is reduced to the second and third amplifier stages 52 and 54.

The transmitter control signal (TX ENABLE) is a logic signal used to enable or disable the power amplifier circuitry 36 by removing the bias from each of the three amplifier stages 50, 52, and 54. A radio frequency signal to be amplified ($RF_{IN}$) is provided at the input 66 of the first amplifier stage 50 and amplified by the three amplifier stages 50, 52, and 54 to provide an amplified output signal ($RF_{OUT}$) at the output 68 the third amplifier stage 54.

Figure 3:
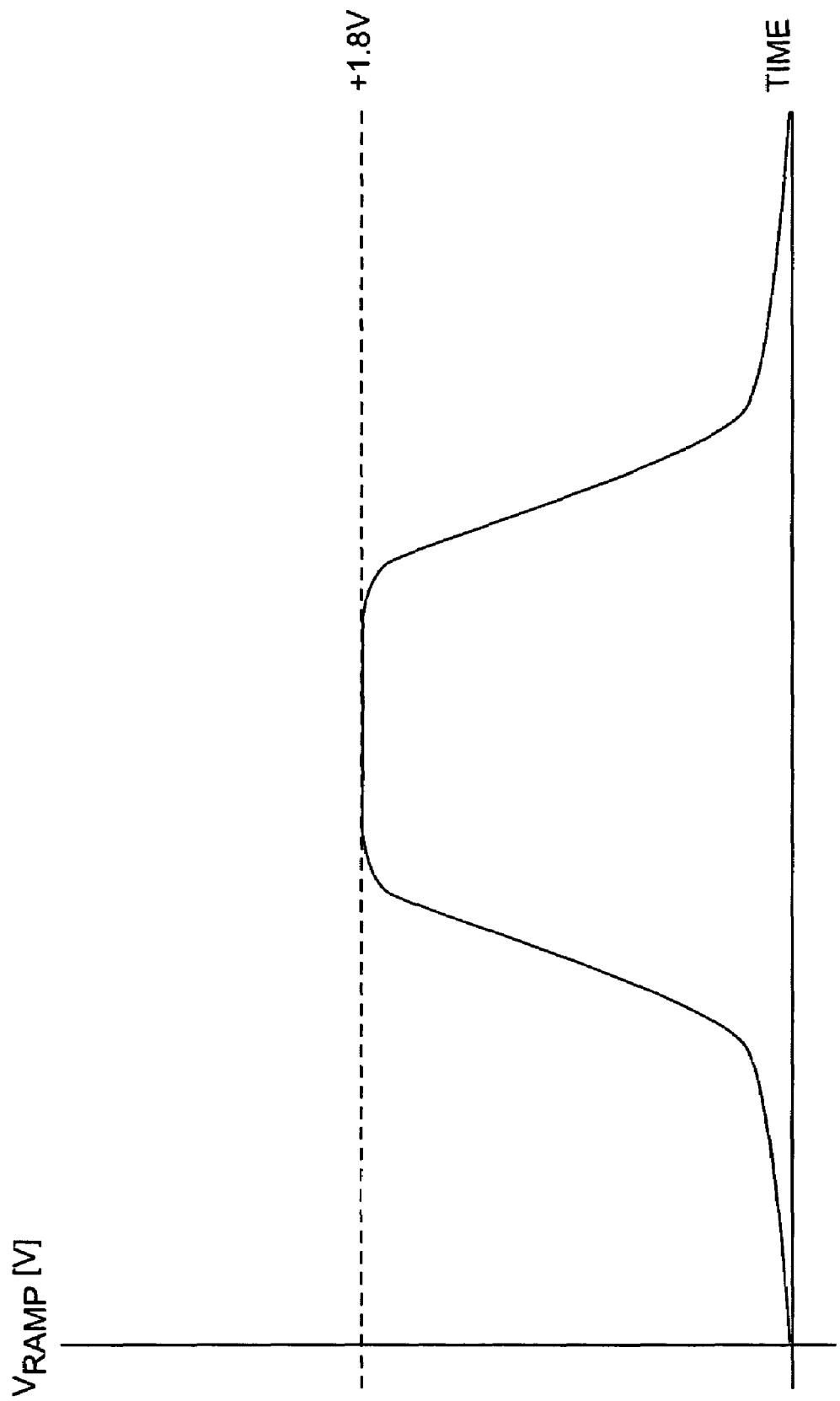
FIG. 3 is an exemplary illustration of an adjustable power control signal used to control the DC—DC conversion circuitry and thus the output power of the power amplifier circuitry according to one embodiment of the present invention.
Figure 4:
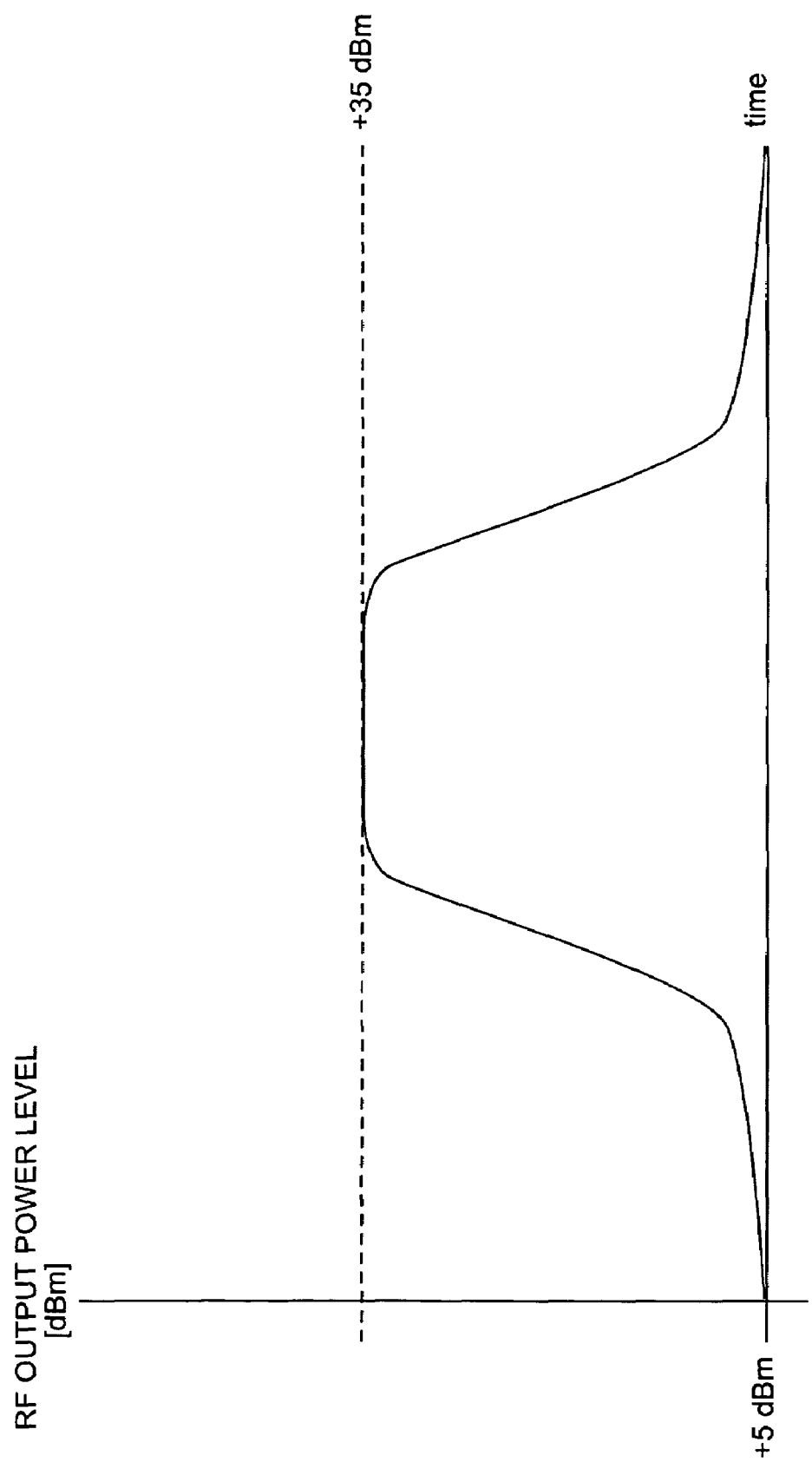
FIG. 4 is an exemplary illustration of the output power of the power amplifier circuitry corresponding to the adjustable power control signal of FIG. 3.

The voltage profile of a typical $V_{RAMP}$ signal is shown in FIG. 3. The current embodiment of the invention limits the $V_{RAMP}$ signal to +1.8 V, however other embodiments of the invention may use less or more voltage to drive the $V_{RAMP}$ input. Turning now to FIG. 4, the output power level as a function of the $V_{RAMP}$ signal of FIG. 3 is illustrated. Notably, the power level tracks the $V_{RAMP}$ signal and ranges from +5 dBm at the minimum to +35 dBm at the maximum for the preferred embodiment. It should be noted that FIGS. 3 and 4 should be considered exemplary rather than limiting.

It should be noted that the power control scheme discussed herein provides many benefits. For example, the supply voltage ($V_{CC}$) is preferably provided such that the first and second amplifier stages 52 and 54 operate in saturation. As another example, by providing the fixed voltage ($V_{PRIM}$) to the first amplifier stage 54, the overall output noise power is not increased when the output power of the power amplifier circuitry 36 is decreased. These benefits along with the many other benefits of this power control scheme are discussed in detail in U.S. Pat. No. 6,701,138, discussed above, which has been incorporated by reference in its entirety.

Certain advantages may be realized by forming two or more of the amplifier stages 50, 52, and 54 from a plurality of transistor cells arranged in parallel. For further information pertaining to the transistor arrays, reference is made to U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. patent application Ser. No. 09/952,524, filed Sep. 14, 2001, the disclosure of which is hereby incorporated by reference. Exemplary bias networks 56 capable of being used in association with the present invention are described in further detail in U.S. Pat. No. 6,313,705, BIAS NETWORK FOR HIGH EFFICIENCY RF LINEAR AMPLIFIER, issued Nov. 6, 2001, which is also assigned to RF Micro Devices and is hereby incorporated by reference in its entirety. Upon understanding the present invention, those skilled in the art will be able to construct any number of bias networks that are compatible with the present invention.

A detailed schematic of a one embodiment of the DC—DC conversion circuitry 38 is illustrated in FIG. 5. In particular, the DC—DC conversion circuitry 38 is, in the illustrated embodiment, a Buck converter. The DC—DC conversion circuitry 38 includes an oscillator (OSC) 70, a converter control system 72, and a power train 74. The converter control system 72 in this example includes an error amplifier 76 and a modulator 78. The oscillator 70 outputs a saw-tooth voltage waveform derived from the voltage on an internal capacitor (not illustrated). In the example, the saw-tooth wave form ramps up and ramps down. Other oscillators 70 may provide a ramp up followed by a rapid return. Regardless of the particular wave form, the voltage is fed to the modulator 78 where it is compared to an error voltage signal 80 from the error amplifier 76.

In the embodiment illustrated, the converter control system 72 operates according to a pulse width modulation scheme as is well understood, although other arrangements are possible and applicable to the present invention. Specifically, the error amplifier 76 of the converter control system 72 compares a feedback signal 82 to the adjustable power control signal ($V_{RAMP}$) and generates the error voltage signal 80. The feedback signal 82 may be conditioned by phase compensation circuitry 84 for stability purposes. The error voltage signal 80 provides the threshold level used by the modulator 78 in processing the clock signal from the oscillator 70 to generate a signal 86. When the clock signal from the oscillator 70 is above the threshold determined by the error voltage signal 80, the signal 86 provided to the power train 74 is low. Conversely, when the clock signal from the oscillator 70 is below the error voltage signal 80 threshold, the power train 74 receives a high signal. In general, the signal 86 driving the power train 74 is a square wave with a duty cycle determined by the level of the error voltage signal 80.

The power train 74 includes an inductor 88, a capacitor 90, plus two switches 92 and 94. In the illustrated embodiment, the switches 92 and 94 are a p-channel FET and an N-channel FET, respectively, as is well understood for a typical buck topology. The square wave signal 86 turns the switches 92 and 94 on and off. When the signal 86 is low, switch 92 is ON and switch 94 is OFF. This presents a voltage close to the primary or fixed voltage ($V_{PRIM}$) to the inductor 88 causing an increase in current and storing energy in the inductor 88's magnetic field. Current is supplied to the power amplifier 36 and to the capacitor 90. When the signal 86 is high, switch 92 is OFF and switch 94 is ON. This connects the input of the inductor 88 to ground. As a result, the inductor 88 provides decreasing current to the power amplifier 36, while drawing energy from its magnetic field. As the output voltage drops, the capacitor 90 discharges and provides some of the load current.

One consideration when using the DC—DC conversion circuitry 38 to provide the supply voltage ($V_{CC}$) to the power amplifier circuitry 36 is the magnitude of a voltage ripple in the supply voltage ($V_{CC}$) caused by the switching frequency of the DC—DC conversion circuitry 38. In general, the frequency of the clock signal from the oscillator 70 causes a ripple in the output voltage ($V_{CC}$). When this voltage is supplied to the power amplifier circuitry 36, the ripple in the supply voltage ($V_{CC}$) mixes with the RF input signal ($RF_{IN}$) and results in spurs in the RF output signal ($RF_{OUT}$). Spurs are frequency components in the output of the power amplifier 36 and are located at frequencies essentially equal to the frequency of the RF input signal plus and minus a frequency of the ripple in the supply voltage ($V_{CC}$). The magnitude of the spurs is dependent upon the magnitude of the ripple in the supply voltage ($V_{CC}$). Thus, DC—DC conversion circuitry 38 can minimize the spurious energy in the output of the power amplifier 36 by minimizing the ripple in the supply voltage ($V_{CC}$). Reducing the spurious energy may be necessary in order to meet the spurious energy specification limits of communications standards such as GSM, DCS, and PCS standards.

As described in U.S. patent application Ser. No. 10/389,849, which is hereby incorporated by reference in its entirety, in one embodiment the oscillator 70 periodically varies the frequency of the clock signal from the oscillator 70, thereby periodically changing the frequency of any ripple that appears in $V_{CC}$. Since the frequency of the ripple changes, the location in the frequency spectrum of the spurs changes. By moving the location of the spurs in the frequency spectrum, the energy at any given frequency is reduced, thereby helping meet the side band emissions requirements.

Figure 6:
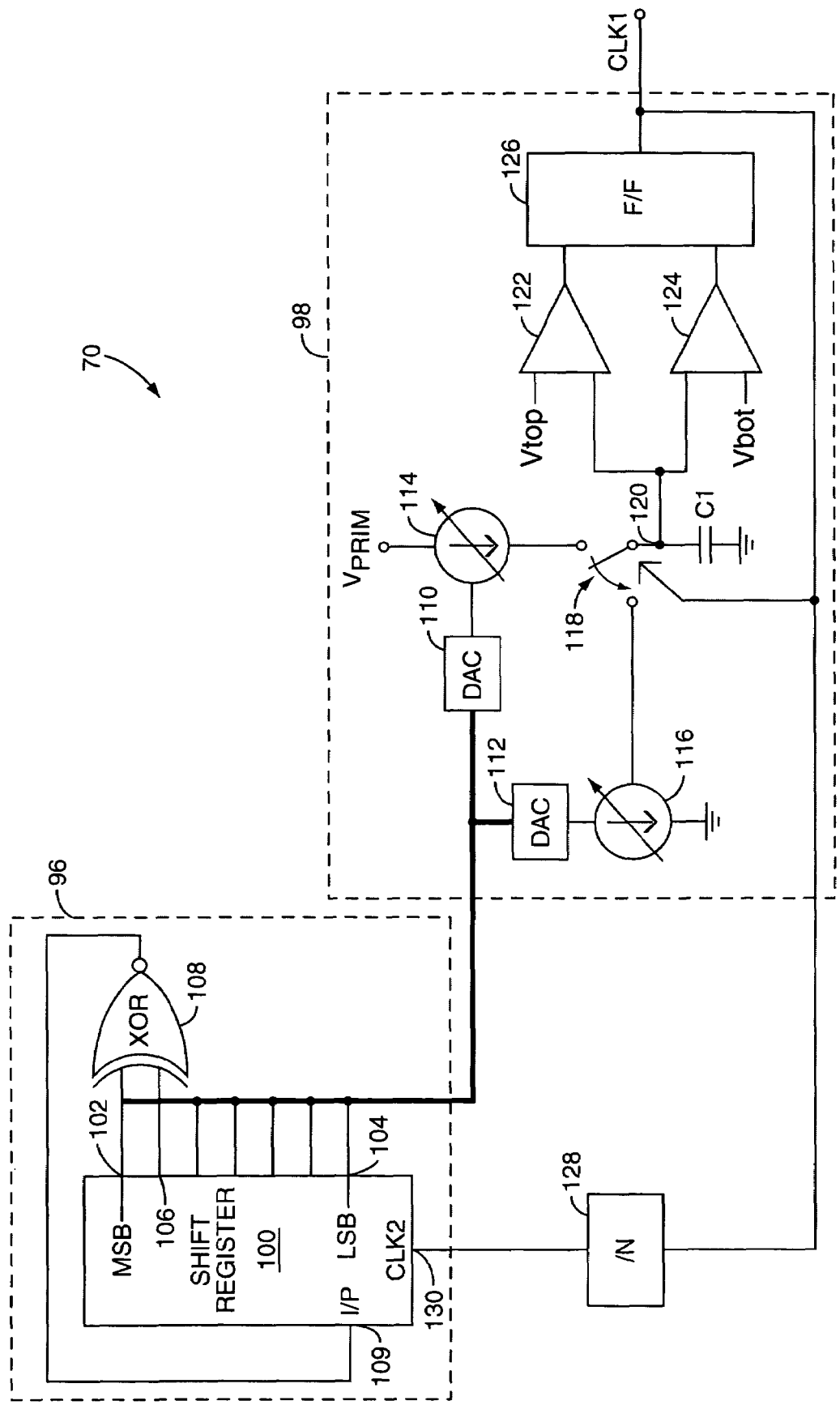
FIG. 6 is a detailed illustration of an oscillator providing a clock signal to a control system of the DC—DC conversion circuitry of FIG. 5 according to one embodiment of the present invention.

FIG. 6 illustrates one embodiment of the oscillator 70 which periodically changes the frequency of the output clock signal as described above. In this embodiment, the oscillator 70 includes a pseudo random number generator 96 and a clock generation circuit 98. The pseudo random number generator 96 includes a seven bit shift register 100 with a most significant bit (MSB) output 102 and a least significant bit (LSB) output 104. Two outputs (which in the exemplary embodiment are the MSB output 102 and the next most significant bit output 106) are directed to an exclusive OR (XOR) gate 108. The output of the XOR gate 108 is fed back into an input 109 of the shift register 100, thereby causing the shift register 100 to count in a pseudo random fashion and thus output a pseudo random number. This is known as a linear feedback shift register (LFSR) and is well known in the art. Other pseudo random number generators 96 could also be used if needed or desired. Likewise, the number of bits in the shift register may vary from embodiment to embodiment as needed or desired.

In addition to the outputs sent to the XOR gate 108, the outputs collectively are sent to the clock generation circuit 98. The clock generation circuit 98 includes a first digital to analog converter (DAC) 110 and a second digital to analog converter (DAC) 112. The DACs 110 and 112 translate the digital signal from the pseudo random number generator 96 into an analog setting that controls variable current sources 114 and 116, respectively. That is, the amount of current that flows through the current sources 114 and 116 is varied by the DACs 110 and 112. The current sources 114 and 116 are selectively connected to a capacitor C1 by a switch 118. The first current source 114 is connected to a reference voltage supply, such as the fixed primary voltage ($V_{PRIM}$), and thus provides current to the capacitor C1 when connected thereto, while the second current source 116 is connected to ground and thus acts as a current sink for the capacitor C1 when connected thereto. When the switch 118 is connected to the first current source 114, the capacitor C1 charges. When the switch 118 is connected to the second current source 116, the capacitor C1 discharges.

As capacitor C1 charges and discharges, a voltage is present at node 120 corresponding to the charge on the capacitor C1. The voltage at node 120 has a saw-tooth voltage waveform due to the current that flows into and out of the capacitor C1. This voltage at node 120 is presented to comparators 122 and 124. First comparator 122 compares the voltage at node 120 to a predefined voltage level Vtop and second comparator 124 compares the voltage at node 120 to a predefined voltage level Vbot. If the voltage at node 120 exceeds Vtop, the first comparator 122 sends a signal to a flip-flop 126. If the voltage at node 120 dips below Vbot, the second comparator 124 sends a signal to the flip-flop 126.

The act of sending a signal to the flip-flop 126 from either comparator 122 or 124 causes the clock signal (CLK1) to be output by the flip-flop 126. This clock signal (CLK1) controls the switch 118 and is further directed to a divide by N element (/N) 128. The divide by N element 128 may have a counter which counts the pulses received in CLK1 and determines if N pulses have been received. Once N pulses have been received, the divide by N element 128 outputs a pulse (CLK2) which is received by the shift register 100 at clock input (CLK2) 130. Thus, the divide by N element 128 effectively divides CLK1 by N to arrive at CLK2. The receipt of the CLK2 signal causes the shift register to perform a "count" and change the pseudo random number being output.

In an exemplary embodiment, the value of N in the divide by N element 128 is such that the pseudo random number output by the shift register changes approximately once every four milliseconds. Since a clock pulse is usually emitted from the flip-flop 126 approximately every four microseconds, N is in the neighborhood of 1000. Having the pseudo random number change approximately once every four milliseconds happens to correspond to the frequency of the transmission bursts in the GSM protocol and the measurement standard propounded under the GSM protocol. Likewise, this time period allows the transient response of the DC—DC conversion circuitry 38 to settle between changes of the pseudo random number.

Accordingly, the oscillator 70 periodically varies the frequency of the clock signal from the oscillator 70, thereby periodically changing the frequency of any ripple that appears in the supply voltage ($V_{CC}$) provided by the DC—DC conversion circuitry 38. Since the frequency of the ripple changes, the location in the frequency spectrum of the resultant spurs in the output of the power amplifier circuitry 36 changes. By moving the location of the spurs in the frequency spectrum, the energy at any given frequency is reduced, thereby helping meet the side band emissions requirements.

Other embodiments of the oscillator 70 that periodically change the frequency of the clock signal provided to the converter control system 72 of the DC—DC conversion circuitry 38 are described in U.S. patent application Ser. No. 10/389,849, mentioned above.

FIG. 7 illustrates an improvement to the oscillator 70 of FIG. 6. As described in U.S. patent application Ser. No. 10/792,486, which is hereby incorporated by reference in its entirety, the N divider 128 of FIG. 6 is replaced by a pseudo random number (PRN) oscillator 132. In general, spurs in the output of the power amplifier circuitry 36 caused by lower CLK1 frequencies are closer to the carrier frequency, which is the frequency of the RF input signal, and spurs caused by higher CLK1 frequencies are further from the carrier frequency. The spurs caused by lower CLK1 frequencies are larger than the spurs caused by higher CLK1 frequencies. One cause of this is that the ripple voltage at the output of the inductor 88 and capacitor 90 (FIG. 5) is larger for lower frequencies than for higher frequencies. Another cause for larger spurs caused by lower CLK1 frequencies is the fact that the divide by N element 128 (FIG. 6) causes the oscillator 70 to spend more time operating at lower frequencies than at higher frequencies. Thus, over time, the average magnitudes of spurs caused by lower CLK1 frequencies are larger than the average magnitudes of spurs caused by higher CLK1 frequencies. For example, if N=4, the time period for four clock cycles when CLK1 is 1 MHz is longer than the time period for four clock cycles when CLK1 is 2 MHz. Thus, for this example, the average magnitudes of the spurs at 899 MHz and 901 MHz are larger than the average magnitude of the spurs at 898 MHz and 902 MHz.

The oscillator 70 of FIG. 7 operates to flatten the spurious spectrum of FIG. 5. More specifically, the oscillator 70 provides the first clock signal (CLK1) having a variable frequency. The frequency of the first clock signal (CLK1) is randomly selected. The PRN oscillator 132 operates to change the frequency of the first clock signal (CLK1) at a second frequency that is inversely related to the frequency of the first clock signal (CLK1). In doing so, the PRN oscillator 132 compensates for the differences in the magnitudes of the spurs caused by lower CLK1 frequencies and the spurs caused by higher CLK1 frequencies. More specifically, the PRN oscillator 132 operates such that the magnitudes of spurs closer to the center frequency are reduced and the magnitudes of spurs further from the center frequencies are increased such that the spurious spectrum is substantially flat, wherein the overall effect is reducing the overall maximum spur level in the frequency spectrum of the RF output signal at the output of the power amplifier circuitry 36.

Additional embodiments of the oscillator 70 similar to the embodiment of FIG. 7 are described in U.S. patent application Ser. No. 10/792,486, mentioned above and incorporated herein by reference.

FIG. 8 illustrates another embodiment of the DC—DC conversion circuitry 38. In this embodiment, the DC—DC conversion circuitry 38 is a multi-phase Buck converter. More specifically, the multi-phase DC—DC conversion circuitry 38 of FIG. 8 is a dual-phase Buck converter. However, it should be noted that the multi-phase DC—DC conversion circuitry 38 can have a greater number of phases in order to further reduce the voltage ripple in the supply voltage ($V_{CC}$).

As described in U.S. patent application Ser. No. 10/858,699, filed Jun. 2, 2004 and entitled MULTI-PHASE SWITCHING POWER SUPPLY FOR MOBILE TELEPHONE APPLICATIONS, which is hereby incorporated by reference in its entirety, the multi-phase DC—DC conversion circuitry 38 of FIG. 8 reduces the magnitude of the ripple in the supply voltage ($V_{CC}$) provided to the power amplifier circuitry 36 from the DC—DC conversion circuitry 38 as compared to the single phase DC—DC conversion circuitry of FIG. 5. By reducing the magnitude of the ripple in the supply voltage ($V_{CC}$), the magnitudes of the resultant spurs in the output of the power amplifier circuitry 36 are also reduced.

The dual-phase DC—DC conversion circuitry 38 includes a dual-phase oscillator (OSC) 134 providing a first clock signal 136 and a second clock signal 138 that is essentially 180° out of phase with the first clock signal 136. It should be noted that the dual-phase oscillator 134 may operate similarly to the oscillators of FIGS. 6 and 7 to periodically change the frequency of the first and second clock signals 136 and 138 in order to further reduce the magnitudes of the spurs in the output of the power amplifier circuitry 36. The dual-phase DC—DC conversion circuitry 38 also includes a dual-phase converter control system 140 and a dual-phase power train 142. The converter control system 140 in this example includes error amplifier 144 and modulators 146A and 146B. The oscillator 134 outputs the first and second clock signals 136 and 138 each having a saw-tooth voltage waveform derived from the voltage on an internal capacitor (not illustrated). In the example, the saw-tooth waveform ramps up and ramps down. Other oscillators 134 may provide a ramp up followed by a rapid return. Regardless of the particular waveform, first and second clock signals 136 and 138 are fed to the modulators 146A and 146B, respectively, where they are compared to an error voltage signal 148 from the error amplifier 144.

In the embodiment illustrated, the dual-phase converter control system 140 operates according to a pulse width modulation scheme as is well understood. Specifically, the error amplifier 144 of the dual-phase converter control system 140 compares a feedback signal 150 to the adjustable power control signal ($V_{RAMP}$) and generates the error voltage signal 148. The feedback signal 150 may be conditioned by compensation circuitry 152 for stability purposes. The error voltage signal 148 provides the threshold level used by the modulators 146A and 146B in processing the signals 136 and 138 from the oscillator 134 to generate first and second signals 154A and 154B. When the signal 136 from the oscillator 134 is above the threshold determined by the error voltage signal 148, the signal 154A provided to the dual-phase power train 142 from the modulator 146A is high. Conversely, when the signal 136 from the oscillator 134 is below the error voltage signal 148 threshold, the signal 154A provided to the dual-phase power train 142 is low. Similarly, when the signal 138 from the oscillator 134 is above the threshold determined by the error voltage signal 148, the signal 154B provided to the dual-phase power train 142 from the modulator 146B is high. When the signal 138 from the oscillator 134 is below the error voltage signal 148 threshold, the signal 154B provided to the dual-phase power train 142 is low. In general, the signals 154A and 154B driving the power train 142 are square wave signals that are essentially 180° out of phase and have a duty cycle determined by the level of the error voltage signal 148.

The dual-phase power train 142 includes inductors 156A and 156B, a capacitor 158, and transistor switches 160A, 160B, 162A, and 162B. The switches 160A and 162A are, in the illustrated embodiment, a p-channel FET and an N-channel FET respectively as is well understood for a typical buck topology. The square wave signal 154A turns the switches 160A, 162A on and off. When the signal 154A is low, switch 160A is ON and switch 162A is OFF. This presents a voltage close to the voltage ($V_{PRIM}$) to the inductor 156A causing an increase in current I1 and storing energy in the inductor 156A's magnetic field. When the signal 154A is high, switch 160A is OFF and switch 162A is ON. This connects the input of the inductor 156A to ground. As a result, the current I1 provided by the inductor 156A decreases, while the inductor 156A draws energy from its magnetic field. Similarly, the switches 160B and 162B are, in the illustrated embodiment, a p-channel FET and an N-channel FET respectively. The square wave signal 154B turns the switches 160B and 162B on and off. When the signal 154B is low, switch 160B is ON and switch 162B is OFF. This presents a voltage close to the voltage ($V_{PRIM}$) to the inductor 156B causing an increase in current I2 and storing energy in the inductor 156B's magnetic field. When the signal 154B is high, switch 160B is OFF and switch 162B is ON. This connects the input of the inductor 156B to ground. As a result, the current I2 provided by the inductor 156B decreases, while the inductor 156B draws energy from its magnetic field.

In combination, the transistor switches 160A and 162A and the transistor switches 160B and 162B provide the currents I1 and I2, respectively, such that the currents I1 and I2 are essentially 180° out of phase. Accordingly, the current ripple in the inductor 156A is essentially 180° out of phase with the current ripple in the inductor 156B. The currents I1 and I2 are summed at capacitor 158 and tend to cancel, thereby resulting in a reduced current ripple and thus a reduced ripple in the output voltage ($V_{CC}$) of the dual-phase DC—DC conversion circuitry 38 as compared to the single-phase DC—DC conversion circuitry of FIG. 5.

FIG. 9 is a detailed schematic of DC—DC conversion circuitry 38 according to another embodiment of the present invention. In particular, the DC—DC conversion circuitry 38 is, in the illustrated embodiment, a multi-phase buck converter having both voltage and current feedback loops. More specifically, the multi-phase DC—DC conversion circuitry 38 is a dual-phase buck converter having both voltage and current feedback loops.

The dual-phase DC—DC conversion circuitry 38 of FIG. 9 operates similarly to the dual-phase DC—DC conversion circuitry 38 of FIG. 8. In general, the DC—DC conversion circuitry 38 includes the dual-phase oscillator (OSC) 134 providing the first clock signal 136 and the second clock signal 138. The converter control system 140' includes the error amplifier 144, current error amplifiers 164A and 164B, and the modulators 146A and 146B. The oscillator 134 outputs the first and second clock signals 136 and 138 each having a saw-tooth voltage waveform derived from the voltage on an internal capacitor (not illustrated). In the example, the saw-tooth waveform ramps up and ramps down. Other oscillators 134 may provide a ramp up followed by a rapid return. Regardless of the particular waveform, first and second clock signals 136 and 138 are fed to the modulators 146A and 146B, respectively, where they are compared to current error signals 166A and 166B, respectively, from the current error amplifiers 164A and 164B.

According to one embodiment of the present invention, the dual-phase DC—DC conversion circuitry 38 includes both an outer voltage feedback loop and two inner current feedback loops. In this embodiment, the outer feedback loop includes the voltage error amplifier 144 that operates based on the voltage feedback signal 150 to provide the error signal 148 which operates as a set-point for the inner current feedback loops. The inner current feedback loops include the current error amplifiers 164A and 164B and the modulators 146A and 146B. It should be noted that each of the current feedback loops operates independently from the other current feedback loops. Thus, the control signal 154A is provided based on the current I1 through the inductor 156A independently from the current I2 through the inductor 156B. It should also be noted that, in one embodiment, the current feedback loops have essentially the same set-point voltage versus current characteristic such that the currents I1 and I2 have essentially the same magnitude.

In the embodiment illustrated, the dual-phase converter control system 140' operates according to a pulse width modulation scheme as is well understood. Specifically, the error amplifier 144 compares the voltage feedback signal 150 to the adjustable power control signal ($V_{RAMP}$) and generates the error voltage signal 148. The voltage feedback signal 150 may be conditioned by the compensation circuitry 152 for stability purposes. The error voltage signal 148 is provided to the current error amplifiers 164A and 164B. The current error amplifiers 164A and 164B compare the error signal 148 to current feedback signals 168A and 168B, respectively, and provide current error signals 166A and 166B. The error signal 166A is provided to the modulator 146A as the threshold level used by the modulator 146A in processing the signal 136 from the oscillator 134 to generate the first signal 154A. The error signal 166B is provided to the modulator 146B as the threshold level used by the modulator 146B in processing the signal 138 from the oscillator 134 to generate the second signal 154B.

When the signal 136 from the oscillator 134 is above the threshold determined by the error signal 166A, the signal 154A provided to the dual-phase power train 142' from the modulator 146A is high. Conversely, when the signal 136 from the oscillator 134 is below the error signal 166A threshold, the signal 154A provided to the dual-phase power train 142' is low. Similarly, when the signal 138 from the oscillator 134 is above the threshold determined by the error signal 166B, the signal 154B provided to the dual-phase power train 142' from the modulator 146B is high. When the signal 138 from the oscillator 134 is below the error signal 166B threshold, the signal 154B provided to the dual-phase power train 142' is low. In general, the signals 154A and 154B driving the dual-phase power train 142' are square wave signals that are essentially 180° out of phase and have a duty cycle determined by the level of the error signals 148, 166A, and 166B.

The dual-phase power train 142' includes the inductors 156A and 156B, the capacitor 158, and the transistor switches 160A, 160B, 162A, and 162B. As discussed above, the square wave signal 154A controls the switches 160A, 162A, and the square wave signal 154B controls the switches 160A, 162B. In addition, the dual-phase power train 142' includes current sensing means 170A and 170B. The current sensing means 170A senses the current in the inductor 156A and provides the current feedback signal 168A to the current error amplifier 164A. The current sensing means 170B senses the current in the inductor 156B and provides the current feedback signal 168B to the current error amplifier 164B. It should be noted that the current sensing means 170A and 170B can be any one of a number of current sensing circuitries and methodologies commonly known.

In operation, the error amplifier 144 compares the output voltage to the adjustable power control signal ($V_{RAMP}$) and supplies the error signal 148 as a set-point to the current error amplifiers 164A and 164B. The error amplifiers 164A and 164B compare the current feedback signals 168A and 168B to the error signal 148 such that the currents I1 and I2 are adjusted to maintain the output voltage. Further, the currents I1 and I2 are controlled such that the currents I1 and I2 through the inductors 156A and 156B are equally matched to an accuracy defined by the accuracy of the current sensing means 170A and 170B and the voltage and current feedback loops.

This control scheme is easily adapted to any multi-phase or interleaved DC—DC converter. More specifically, the DC—DC conversion circuitry 38 may include any number of phases wherein the current in each inductor 156 is controlled by a separate current loop. The set-point for the current loops is provided by a single voltage control loop. The steady state current provided by each phase will be matched to an accuracy produced by the errors of the current sensing feedback loops.

The present invention provides substantial opportunity for variation without departing from the spirit and scope of the present invention. For example, the power amplifier circuitry 36 and the DC—DC conversion circuitry 38 may be incorporated into a single module. However, the inductors and/or capacitors of the DC—DC conversion circuitry 38 may be incorporated into the module or may alternatively be external components. As another example, the power amplifier circuitry 36 and the DC—DC conversion circuitry 38 may be formed on a single semiconductor die. However, the inductors and/or capacitors of the DC—DC conversion circuitry 38 may be formed in the substrate of the semiconductor die or may alternatively be external components. As yet another example, three schemes have been described for reducing the magnitude of spurs in the output of the power amplifier circuitry 36. Namely, a first scheme varies the switching frequency of the DC—DC conversion circuitry 38, thereby spreading the spurious output power (FIG. 6). A second scheme is an improvement to the first scheme where the switching frequency is varied at a second frequency inversely related to the switching frequency (FIG. 7). In doing so, the spurious output spectrum of the power amplifier circuitry 36 is substantially flattened with an overall effect of reducing the maximum magnitude of the spurious spectrum. A third scheme utilizes a multi-phase switching DC—DC conversion circuitry 38 (FIGS. 8 and 9) which reduces the ripple in the supply voltage ($V_{CC}$), thereby reducing the magnitude of the spurs in the output of the power amplifier circuitry 36. It should be noted that the DC—DC conversion circuitry 38 may include none, one, or any combination of these three schemes. As yet another example, although the adjustable power control signal ($V_{RAMP}$) is described above as an analog signal, the adjustable power control signal ($V_{RAMP}$) may alternatively be a digital signal. In such case, the DC—DC conversion circuitry 38 of the present invention could easily be adapted to receive the digital signal, as will be apparent to one of ordinary skill in the art.

It should also be noted that the present invention is equally applicable to transmitters operating according to a polar modulation scheme. In such case, a frequency or phase component of a polar transmit signal is amplified by the power amplifier circuitry 36. The DC—DC conversion circuitry 38 may be controlled by an amplitude component of a polar transmit signal or a combination of a power control signal and the amplitude component of the polar transmit signal. Accordingly, the power amplifier circuitry 36 provides both amplification and amplitude modulation of the frequency or phase component of the polar transmit signal.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   power amplifier circuitry comprising at least one output amplifier stage coupled in series with an input amplifier stage and adapted to amplify a radio frequency (RF) input signal, the at least one output amplifier stage adapted to receive a variable supply voltage, wherein the input amplifier stage is adapted to receive a substantially fixed voltage;
   a switching DC—DC converter adapted to provide the variable supply voltage based on the substantially fixed voltage and an adjustable power control signal, the adjustable power control signal provided to control an output power of the power amplifier circuitry by controlling the variable supply voltage provided to the at least one output amplifier stage; and
   bias circuitry adapted to bias each of the input amplifier stage and the at least one output amplifier stage.

2. The system of claim 1 wherein the bias circuitry is further adapted to provide a constant bias to each of the input amplifier stage and the at least one output amplifier stage.

3. The system of claim 1 wherein the bias circuitry is further adapted to provide a constant bias to the input amplifier stage and a variable bias to the at least one output amplifier stage, the variable bias provided such that the variable bias is reduced when the variable supply voltage is reduced.

4. The system of claim 1 wherein the at least one output amplifier stage comprises:
   a first amplifier stage coupled in series with the input amplifier stage and adapted to receive the variable supply voltage; and
   a second amplifier stage coupled in series with the first amplifier stage and adapted to receive the variable supply voltage.

5. The system of claim 1 wherein the power amplifier circuitry, the switching DC—DC converter, and the bias circuitry are incorporated into a single module.

6. The system of claim 5 wherein the switching DC—DC converter comprises at least one external inductor, wherein the external inductor is not incorporated into the single module.

7. The system of claim 5 wherein the switching DC—DC converter comprises at least one inductor, wherein the inductor is incorporated into the single module.

8. The system of claim 1 wherein the power amplifier circuitry, the switching DC—DC converter, and the bias circuitry are formed on a single semiconductor die.

9. The system of claim 8 wherein the switching DC—DC converter comprises at least one external inductor, wherein the external inductor is not formed on the single semiconductor die.

10. The system of claim 8 wherein the switching DC—DC converter comprises at least one inductor, wherein the inductor is formed in a substrate of the single semiconductor die.

11. A system comprising:
    power amplifier circuitry comprising at least one output amplifier stage coupled in series with an input amplifier stage and adapted to amplify a radio frequency (RF) input signal, the at least one output amplifier stage adapted to receive a variable supply voltage;

a switching DC—DC converter adapted to provide the variable supply voltage based on a substantially fixed voltage and an adjustable power control signal, the adjustable power control signal provided to control an output power of the power amplifier circuitry by controlling the variable supply voltage provided to the at least one output amplifier stage, wherein the switching DC—DC converter comprises:
  a oscillator adapted to provide a variable clock signal;
  a converter control system adapted to provide a control signal and control a duty cycle of the control signal based on the variable clock signal and the adjustable power control signal; and
  a power train adapted to provide the variable supply voltage based on the control signal; and
bias circuitry adapted to bias each of the input amplifier stage and the at least one output amplifier stage.

12. The system of claim 11 wherein the oscillator is further adapted to provide the variable clock signal and periodically vary a frequency of the variable clock signal.

13. The system of claim 11 wherein the oscillator is further adapted to provide the variable clock signal and randomly select a frequency of the variable clock signal such that the frequency of the variable clock signal changes at a second frequency that is inversely related to the frequency of the variable clock signal.

14. The system of claim 11 wherein the oscillator comprises:
  a pseudo random number generator operating based on a second clock signal;
  clock generation circuitry adapted to provide the variable clock signal based on an output of the pseudo random number generator; and
  divider circuitry adapted to provide the second clock signal by generating a pulse after every N cycles of the variable clock signal, wherein N is a number greater than 1.

15. The system of claim 11 wherein the oscillator comprises:
  clock generation circuitry adapted to generate the variable clock signal; and
  circuitry adapted to control the clock generation circuitry such that a frequency of the variable clock signal is randomly selected and the frequency of the variable clock signal changes at a second frequency that is inversely related to the frequency of the variable clock signal.

16. The system of claim 11 wherein the oscillator comprises:
  clock generation circuitry adapted to generate the variable clock signal; and
  circuitry adapted to control the clock generation circuitry such that a frequency of the variable clock signal is varied thereby spreading frequencies of spurious radio frequency signals in an output signal of the power amplifier circuitry to reduce interference caused by the spurious radio frequency signals.

17. A system comprising:
  power amplifier circuitry comprising at least one output amplifier stage coupled in series with an input amplifier stage and adapted to amplify a radio frequency (RF) input signal, the at least one output amplifier stage adapted to receive a variable supply voltage;
  a switching DC—DC converter adapted to provide the variable supply voltage based on a substantially fixed voltage and an adjustable power control signal, the adjustable power control signal provided to control an output power of the power amplifier circuitry by controlling the variable supply voltage provided to the at least one output amplifier stage, wherein the switching DC—DC converter is a multi-phase DC—DC converter; and
  bias circuitry adapted to bias each of the input amplifier stage and the at least one output amplifier stag.

18. The system of claim 17 wherein the multi-phase DC—DC converter comprises:
  a multi-phase converter control system adapted to provide a plurality of control signals based on the adjustable power control signal, the substantially fixed voltage, and a plurality of clock signals, wherein each of the plurality of clock signals is out of phase with a first of the plurality of clock signals by a multiple of 360°/N and N is the number of control signals in the plurality of control signals; and
  a multi-phase power train adapted to generate a plurality of currents each based on a corresponding one of the plurality of control signals and provide the plurality of currents to a first terminal of an output capacitor, wherein the plurality of currents charge the output capacitor such that the variable supply voltage is provided across the output capacitor.

19. The system of claim 18 wherein the multi-phase DC—DC converter further comprises an oscillator adapted to provide the plurality of clock signals and periodically vary a frequency of the plurality of clock signals.

20. The system of claim 18 wherein the multi-phase DC—DC converter further comprises an oscillator adapted to provide the plurality of clock signals and randomly select a frequency of the plurality of clock signals such that the frequency of the plurality of clock signals changes at a second frequency that is inversely related to the frequency of the plurality of clock signals.

21. The system of claim 17 wherein the multi-phase DC—DC converter comprises:
  a plurality of inductors each having a first terminal coupled to an output capacitor;
  a plurality of switching circuitries each adapted to couple a second terminal of one of the plurality of inductors to either the source voltage or a current return path based on one of a plurality of control signals;
  a plurality of current sensing means each adapted to generate a current feedback signal indicative of a current through one of the plurality of inductors;
  a plurality of current feedback loops each adapted to generate one of the plurality of control signals based on the current feedback signal from one of the plurality of current sensing means and a current loop set-point voltage; and
  a voltage feedback loop adapted to generate the current loop set-point voltage based on the adjustable power control signal and a voltage feedback signal indicative of the variable supply voltage.

22. The system of claim 21 wherein each of the plurality of current feedback loops operates independently from each other of the plurality of current feedback loops.

23. The system of claim 21 wherein each of the plurality of current feedback loops has essentially the same current loop set-point voltage versus current characteristic such that the currents through the plurality of inductors have essentially the same magnitude.

24. The system of claim 1 wherein the system is a mobile terminal further comprising a control system adapted to provide the adjustable power control signal for controlling the output power of the power amplifier circuitry.

25. A method comprising:
providing at least one output amplifier stage coupled in series with an input amplifier stage for amplifying a radio frequency (RF) input signal to provide an amplified RF signal;
providing a substantially fixed voltage to the input amplifier stage as a fixed supply voltage;
providing a variable supply voltage to the at least one output amplifier stage from a switching DC—DC converter based on the substantially fixed voltage and an adjustable power control signal, the adjustable power control signal provided to control an output power of the amplified RF signal by controlling the variable supply voltage provided to the at least one output amplifier stage; and
providing a bias to each of the input amplifier stage and the at least one output amplifier stage.

26. The method of claim 25 wherein the step of providing the bias comprises providing a constant bias to each of the input amplifier stage and the at least one output amplifier stage.

27. The method of claim 25 wherein the step of providing the bias comprises providing a constant bias to the input amplifier stage and providing a variable bias to the at least one output amplifier stage.

28. A method comprising:
providing at least one output amplifier stage coupled in series with an input amplifier stage for amplifying a radio frequency (RF) input signal to provide an amplified RF signal;
providing a variable supply voltage to the at least one output amplifier stage from a switching DC—DC converter based on the substantially fixed voltage and an adjustable power control signal, the adjustable power control signal provided to control an output power of the amplified RF signal by controlling the variable supply voltage provided to the at least one output amplifier stage, wherein providing the variable supply voltage comprises:
providing a variable clock signal;
providing a control signal based on the variable clock signal and the adjustable power control signal, wherein a duty cycle of the control signal is controlled based on variable clock signal and the adjustable power control signal; and
providing the variable supply voltage based on the control signal; and
providing a bias to each of the input amplifier stage and the at least one output amplifier stage.

29. The method of claim 28 wherein the step of providing the variable clock signal comprises providing the variable clock signal and periodically varying a frequency of the variable clock signal.

30. The method of claim 28 wherein the stop of providing the variable clock signal comprises providing the variable clock signal and randomly selecting a frequency of the variable clock signal such that the frequency of the variable clock signal changes at a second frequency that is inversely related to the frequency of the variable clock signal.

31. The method of claim 28 wherein the step of providing the variable clock signal comprises:
generating a pseudo random number based on second clock signal;
providing the variable clock signal based on the pseudo random number; and
generating the second clock signal by generating a pulse after every N cycles of the variable clock signal such that the pseudo random number and thus a frequency of the variable clock signal changes after every N cycles of the variable clock signal, wherein N is a number greater than 1.

32. The method of claim 28 wherein the step of providing the variable clock signal comprises;
generating a pseudo random number based on a second clock signal;
providing the variable clock signal based on the pseudo random number; and
providing the second clock signal such that the pseudo random number and thus a frequency of the variable clock signal changes at a second frequency that is inversely related to the frequency of the variable clock signal.

33. A method comprising:
providing at least one output amplifier stage coupled in series with an input amplifier stage for amplifying a radio frequency (RF) input signal to provide an amplified RF signal;
providing a variable supply voltage to the at least one output amplifier stage from a switching DC—DC converter based on the substantially fixed voltage and an adjustable power control signal, the adjustable power control signal provided to control an output power of the amplified RF signal by controlling the variable supply voltage provided to the at least one output amplifier stage, wherein providing the variable supply voltage comprises:
providing a plurality of control signals based on the adjustable power control signal, the substantially fixed voltage, and a plurality of clock signals, wherein each of the plurality of clock signals is out of phase with a first of the plurality of clock signals by a multiple of 360'/N and N is the number of control signals in the plurality of control signals;
generating a plurality of currents each based on a corresponding one of the plurality of control signals; and
providing the plurality of currents to a first terminal of an output capacitor, thereby charging the output capacitor such that the variable supply voltage is provided across the output capacitor; and
providing a bias to each of the input amplifier stage and the at least one output amplifier stage.

34. The method of claim 33 wherein the step of providing the variable supply voltage further comprises providing the plurality of clock signals and periodically varying a frequency of the plurality of clock signals.

35. The method of claim 33 wherein the step of providing the variable supply voltage further comprises providing the plurality of clock signals and randomly selecting a frequency of the plurality of clock signals such that the frequency of the plurality of clock signals changes at a second frequency that is inversely related to the frequency of the plurality of clock signals.

36. The method of claim 33 wherein the step of providing the variable supply voltage further comprises providing the plurality of clock signals and varying a frequency of the plurality of clock signals thereby spreading frequencies of spurious radio frequency signals in an output signal of the at least one output amplifier stage to reduce interference caused by the spurious radio frequency signals.

37. The method of claim 33 wherein the step of providing the variable supply voltage further comprises generating a plurality of current feedback signals each indicative of one of the plurality of currents, wherein the step of providing the plurality of control signals is further based on the plurality of current feedback signals.

38. The method of claim 37 wherein each of the plurality of control signals is provided based on a corresponding one of the plurality of current feedback signals and independently from each other of the plurality of current feedback signals.

\* \* \* \* \*